(12) United States Patent
Mirkin et al.

(10) Patent No.: US 11,415,877 B2
(45) Date of Patent: Aug. 16, 2022

(54) LIQUID MASKS FOR MICROFABRICATION PROCESSES

(71) Applicant: NORTHWESTERN UNIVERSITY, Evanston, IL (US)

(72) Inventors: Chad A. Mirkin, Wilmette, IL (US); David A. Walker, Evanston, IL (US); James L. Hedrick, III, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 683 days.

(21) Appl. No.: 16/465,605

(22) PCT Filed: Dec. 7, 2017

(86) PCT No.: PCT/US2017/065092
§ 371 (c)(1),
(2) Date: May 31, 2019

(87) PCT Pub. No.: WO2018/106904
PCT Pub. Date: Jun. 14, 2018

(65) Prior Publication Data
US 2019/0384161 A1 Dec. 19, 2019

Related U.S. Application Data

(60) Provisional application No. 62/431,116, filed on Dec. 7, 2016.

(51) Int. Cl.
*G03F 7/00* (2006.01)
*G03F 7/20* (2006.01)
*G03F 1/38* (2012.01)

(52) U.S. Cl.
CPC .............. *G03F 1/38* (2013.01); *G03F 7/2051* (2013.01); *G03F 7/70391* (2013.01)

(58) Field of Classification Search
CPC ...... G03F 1/38; G03F 7/2051; G03F 7/70391; G03F 1/54; G03F 7/0002; G03F 7/70958; G03F 1/50; G03F 7/7005; G03F 7/0025; G03F 7/162; G03F 7/2063
See application file for complete search history.

(56) References Cited

U.S. PATENT DOCUMENTS

| | | | |
|---|---|---|---|
| 5,776,748 A | 7/1998 | Singhvi et al. |
| 6,500,549 B1 | 12/2002 | Deppisch et al. |
| 6,596,346 B2 | 7/2003 | Bernard et al. |
| 2002/0001283 A1 | 1/2002 | Niwa et al. |

(Continued)

FOREIGN PATENT DOCUMENTS

| | | |
|---|---|---|
| JP | 2012-011478 A | 1/2012 |
| WO | WO-2016/018880 A1 | 2/2016 |

OTHER PUBLICATIONS

Chang et al., Parallel multi-step nanolithography by nanoscale Cu-covered h-PDMS tip array, J. Micromech Microeng, 24(9):95022 (Aug. 2014).

(Continued)

*Primary Examiner* — Nghia M Doan
(74) *Attorney, Agent, or Firm* — Marshall, Gerstein & Borun LLP

(57) ABSTRACT

Disclosed herein are methods of using a fluoro oil mask to prepare a beam pen lithography pen array.

20 Claims, 9 Drawing Sheets

Fabricated Array With Traditional Resist Masking

Fabricated Array With Local Deviation

Fabricated Array With Global Deviation

(56) References Cited

U.S. PATENT DOCUMENTS

| | | |
|---|---|---|
| 2008/0102192 A1 | 5/2008 | Johnson et al. |
| 2011/0132220 A1 | 6/2011 | Mirkin et al. |
| 2011/0305996 A1 | 12/2011 | Mirkin et al. |
| 2012/0128882 A1 | 5/2012 | Mirkin et al. |
| 2012/0167262 A1 | 6/2012 | Mirkin et al. |
| 2015/0286148 A1 | 10/2015 | Mirkin et al. |
| 2015/0309073 A1* | 10/2015 | Mirkin .................. B82Y 40/00 427/532 |

OTHER PUBLICATIONS

Chen et al., Beam pen lithography based on arrayed polydimethylsiloxane (PDMS)) micro-pyramids spin-coated with carbon black photo-resist, J. Micromech. Microeng., 24(4): 45007 (Mar. 2014).
European Patent Application No. 17878512.7, Extended European Search Report, dated Jul. 8, 2020.
Hu et al., Nano-fabrication with a flexible array of nano-apertures, Nanotechnology, 23(17):175303 (May 2012).
Donzel et al., Hydrophilic Poly(dimethylsiloxane) Stamps for Microcontact Printing, Adv. Mater., 13(15):1164-7 (2001).
He et al., Preparation of Hydrophilic Poly(dimethylsiloxane) Stamps by Plasma-Induced Grafting, Langmuir, 19(17):6982-6 (2003).
Huo et al., Beam pen lithography, Nat. Nanotechnol., 5(9):637-40 (Sep. 2010).
International Application No. PCT/US17/65092, International Preliminary Report on Patentability, dated Jun. 11, 2019.
International Application No. PCT/US17/65092, International Search Report and Written Opinion, dated Feb. 15, 2018.
Liao et al., Desktop nanofabrication with massively multiplexed beam pen lithography, Nat. Commun., 4:2103 (2013).
Martin et al., Direct protein microarray fabrication using a hydrogel "stamper", Langmuir, 14(15):3971-5 (1998).
Schmid et al., Siloxane Polymers for High-Resolution, High-Accuracy Soft Lithography, 33(8):3042-9 (2000).
Japanese Patent Application No. 2019-530403, Notice of Reasons for Rejection, dated Nov. 2, 2021.

* cited by examiner

Fabricated Array With Traditional Resist Masking

Fabricated Array With Local Deviation

Fabricated Array With Global Deviation

LIQUID MASKS FOR MICROFABRICATION PROCESSES

STATEMENT OF GOVERNMENT SUPPORT

This invention was made with government support under DE-SC0000989 awarded by the Department of Energy and FA9550-16-1-0150 awarded by the Air Force Office of Scientific Research. The government has certain rights in the invention.

SUMMARY

Provided herein are methods of making a beam pen lithography tip array, comprising providing a tip array comprising a plurality of tips fixed to a common substrate, the common substrate fixed to a support, the plurality of tips and common substrate each comprising an at least translucent material, each tip having a radius of curvature of less than 1 µm, the tip array further comprising a coated surface comprising a blocking layer, the coated surface disposed over the plurality of tips; casting a mask material onto the tip array to form a mask over the tip array that provides an exposed portion of each tip of the tip array, wherein the mask material and the blocking layer interact via capillary action to form the mask over the tip array and provide substantially uniform exposed portions of each tip, and forming an aperture at the exposed portion of each tip by removing the blocking layer at the exposed portion of each tip.

Also provided are methods for sub-micron scale printing of indicia on a photosensitive substrate, comprising orienting the photosensitive substrate near or in contact with a tip array prepared by a method disclosed herein, wherein the photosensitive substrate and the tip array are within 1 µm of each other; irradiating at least one tip of the tip array with a radiation source, to transmit radiation through the tip aperture; and exposing a portion of the photosensitive substrate with the transmitted radiation to print the indicia on the substrate surface.

DETAILED DESCRIPTION

Microfabrication techniques such as photolithography, spin coating, vacuum deposition, and chemical etching have enabled great strides in material patterning at the micron to nanometer length scales. Generally, when these techniques are applied over large areas, there exists local uniformity (on the millimeter scale) but global inhomogeneity from one side of a wafer to another (across several centimeters). Such variations can have increasingly undesirable impacts on the subsequent downstream microfabrication steps, which can result in certain structures being all but impossible to fabricate in a uniform manner across large areas. One such example of a systematic global variation might be a change in feature height from one side of a wafer to another. In this case, attempting to apply an even masking layer on top of these uneven features can cause variations in the areas exposed through the masking layer. Some features will be over exposed, and thus, above the mask, while some will remain well below the mask completely unexposed. Such variations in exposed areas can eventually lead to inhomogeneous structures in a microfabrication step (such as selective deposition, chemical modification, etching, etc.). To avoid such an occurrence, disclosed herein is a self-leveling mask that can adapt to the contours of the features so as to coat the irregular surface in way which leaves evenly exposed features.

Both polymer pen lithography (PPL) and beam pen lithography (BPL) have proven to be versatile nanolithographic techniques. One drawback from these techniques is that there is a pyramid to pyramid (pen-to-pen) height variation that occurs from imperfect Si molds used in the fabrication of the PDMS arrays. In BPL, these variations are compounded and result in variations in aperture size. The current method for etching gold-coated PPL arrays to create beam pen arrays is to (1) spin coat a uniform layer of photoresist onto a substrate, (2) perform a top down dry etch to expose the pyramid tip a given height from the base of the pyramid, (3) wet etch the exposed gold region (or selected blocking layer), and (4) lift off to remove the masking layer (FIG. 6, (a)). Across small areas (~1,000 pens or less) and with perfect Si molds, it is possible to achieve sub diffraction apertures. When scaling this approach up to millions of pyramids dispersed over several square inches the result is an array that is 'patchy,' as variation in tip height across the array results in regions with large apertures (~10 μm), regions with no apertures, and gradients spanning this range. Thus, it is necessary to develop a new method for etching that can accommodate both the local and global variations in pyramid height variation.

Figure 6:
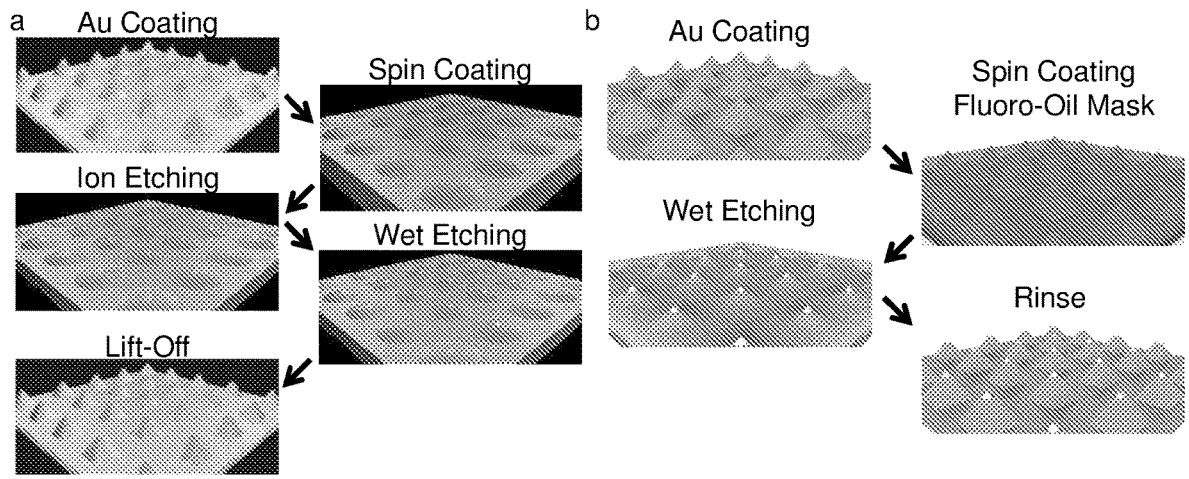
FIG. 6 shows (a) Traditional process for fabricating beam pen apertures. First, a photoresist is spin coated on followed by a dry and wet etch, and finally a lift off is done to remove the photoresist. (b) New method for fabricating beam pen apertures with a liquid mask. First the fluoro-oil layer is spin coated onto the gold pen array a to be used as a liquid mask. This is followed by wet etching to remove the gold and a rinsing step to remove the etchant and oil.

One approach to advert variations in feature height is the use of a self-leveling mask which adapts to the contours of each feature, enabling one to coat an irregular surface with uniformly exposed features (FIG. 6, (b)). This is differentiated from classical photo-lithography masks in that the presently disclosed approach seeks to form uniform features using a mask with irregular thickness, whereas classical photo-lithography techniques seek to apply an even masking layer. Instrumental to this general approach is the ability, at some point in the process, for the masking material to be able to 'flow' and wet the surface. During this period, the mask conforms to the underlying substrate and capillary forces result in flux-pinning of the masking material to the tips of the pyramidal features.

Figure 7:
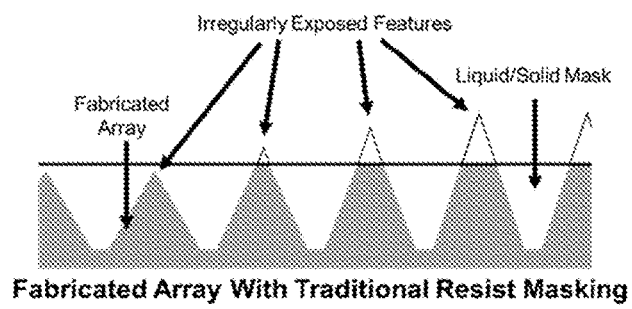
FIG. 7 shows tip arrays coated with a mask.
Figure 7:
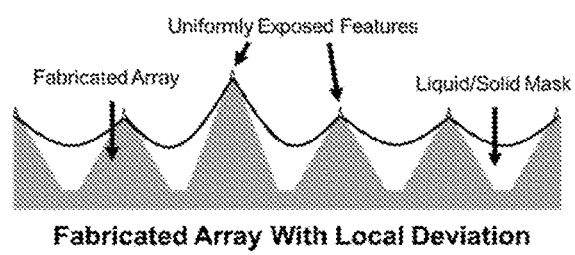
Figure 7:
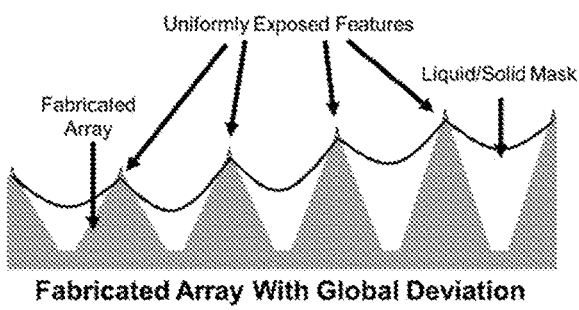

A Typical Protocol Includes: (a) Optional modification of substrate surface to promote surface-wetting or surface-dewetting as desired based upon the selected mask material; (b) casting (e.g., spin coating) the mask material onto surface as a fluid formulation (final mask can be fluid or solid, but preferably be a fluid or gel like material to wet and conform to the surface contours at the time of casting) so as to apply a thin layer approximately the height of the features of interest; (c) Optional heat treatment of substrate and fluid to decrease masking material viscosity to speed up coating of the masking material to the surface contours of the blocking layer; (d) Material deposition, etching, or modification to the uniformly exposed regions; and (e) Optional removal of masking material if desired. The features of this method are depicted in FIG. 7 (middle and bottom) in comparison to prior methods (top).

The blocking layer can comprise metals, metal oxides, polymers, ceramics, or composites. Specific examples for the blocking layer include Au, Ag, Al, Ti, Cu, Fe, Co, Ni, Zn, Pt, Pd, Pb, and/or oxides or alloys of these metals (e.g., $Al_2O_3$, $TiO_2$, $ZnO_2$, $Fe_2O_3$, or the like). Other blocking layers contemplated include polymers, hydrogels, polymer/particulate composites, carbon nanotubes, graphene, or the like. In some cases, the blocking layer can further comprise a self-assembled monolayer (SAM) on the surface of the layer. In some cases, the blocking layer undergoes a treatment changes the manner in which the mask material wets the surface of the blocking layer (e.g., the blocking layer is oxidized in a plasma cleaner, polished in a reducing environment, has a thin layer of polymer or carbon applied, or the like).

The mask material can comprise a range of solids and liquids that are immiscible (or are sparingly soluble) with the intended etchant. Examples include organic, silicone, or fluorinated oils, polymers, or greases, collectively termed "fluorinated oil". Fluorinated (or more specifically perfluorinated) oils include Kyrtox branded oils, e.g., Krytox GPL-100, GPL-107, XHT-1000. Fluorinated (or more specifically perflourinated) greases can be prepared from any fluorinated oil. The mask material can comprise a polymer, e.g., a thermoplastic. Specifically contemplated polymers include poly(methyl methacrylate) (PMMA), polypropylene (PP) acrylonitrile butadiene styrene (ABS), nylon, polylactic acid (PLA), polybenzimidazole (PBI), polycarbonate (PC), polyether sulfone (PES), polyoxymethylene (POM), polyetherether ketone (PEEK), polyetherimide (PEI), polyethylene (PE) of varying molecular weights and densities, polystyrene (PS), polyvinyl chloride (PVC), Teflon (PTFE), or any combination thereof. In some cases, the mask material comprises a thermoplastic, such as PMMA or PP.

The SAM and/or the blocking layer can comprise a material that provides a suitable interaction with the mask material to provide capillary action (attractive or repulsive) between the two and result in the desired substantially uniform exposed portions of the tips of the tip array. Some contemplated compatible SAM and/or blocking layers and mask materials include aliphatic alkane thiols with organic greases and polymers, perfluorinated alkane thiols with Kryotox oils, $SiO_2$ coatings with silicon oils.

The casting of the mask material can comprise spin coating, drop casting, spray coating, or film casting. In some cases, the mask material is a solid and the casting comprises applying the solid to the tip array. In some cases, the mask material is a solid that is subsequently heated or melted to a semi-solid or liquid state following application to the tip array (e.g., film casting a thin polymer sheet, then melting the sheet to provide a conformal coating across the pen array).

By spin coating a fluoro-oil liquid over the gold-coated array (gold can be modified with a perfluorinated alkane thiol for wetting between the blocking material and mask material), the oil has the ability to wet the sides of the pyramids and form meniscuses spanning the apex of each gold-coated tip. Despite the weight of the oil the effect of surface tension causes the oil to wet the gold surface and climb above the average liquid level, overpowering gravitational forces at this length scale. The oil, as a consequence, pins at the apex of each pyramid presumably forming a 3-phase interface. Upon application of a gold etchant, the etchant comes into contact with the gold only at the 3-phase interface (i.e. the tip of the pyramids) and begins to dissolve the gold layer. Owing that the gold layer and any subsequent self-assembled monolayer attached to the gold is responsible for the favorable surface wetting phenomena, as the gold is dissolved away the oil layer retreats from the apex of each pen in the array along this etching front in a uniform manner. The end result is the ability to have a much higher uniformity in the generation of beam pen apertures over very large domains.

A mask material is applied to the surface of the tip array, e.g., spin-coated with a liquid mask, such as a fluoro-oil. Then, the exposed portions of the tips of the tip array are exposed to conditions that allow removal of the blocking layer, e.g., undergo a wet etching step, to provide the tip aperture in a more uniform fashion. This technique exploits the surface tension between the mask material and the blocking layer of the tip array such that substantially (e.g., within 10% or within 5% or with 1% variance) similar amounts of the tip are exposed above the mask and capable of aperture formation during the aperture forming (e.g., wet etching) step. The blocking layer can be removed by any means suitable to remove the blocking layer. The blocking layer can be removed by wet-etching, plasma-etching, ion-etching, electrochemical etching/polishing. For example, when the blocking layer comprises a metal, the metal (e.g., gold) can be remove by contact with an etchant (e.g., a gold etchant). Contemplated etchants include iodine based etchant solutions, cyanide etching solutions, strong base/acid etchants.

Multimillion tip BPL arrays (e.g., 4.84 million tips in a 1.75 inch by 1.75 inch square domain) can be prepared using this technique having an aperture diameter variance between 3% to 9%. One specific tip array had a global average aperture size of all the pens being about 354 nm×266 nm with a 3% variance in one dimension of the 1.75"×1.75" pen array and a 9% variance in the second perpendicular dimension of the pen array. Depending on the quadrant of the array, the local averages were (1, FIG. 8, top left) 343±63 nm×249±60 nm; (2, FIG. 8 top right) 365±nm×270±50 nm; (3, FIG. 8 middle) 354±51 nm×266±45 nm; (4, FIG. 8 bottom left) 365±52 nm×270±50 nm; and (5, FIG. 8 bottom right) 388±47 nm×275±39 nm.

Figure 8:
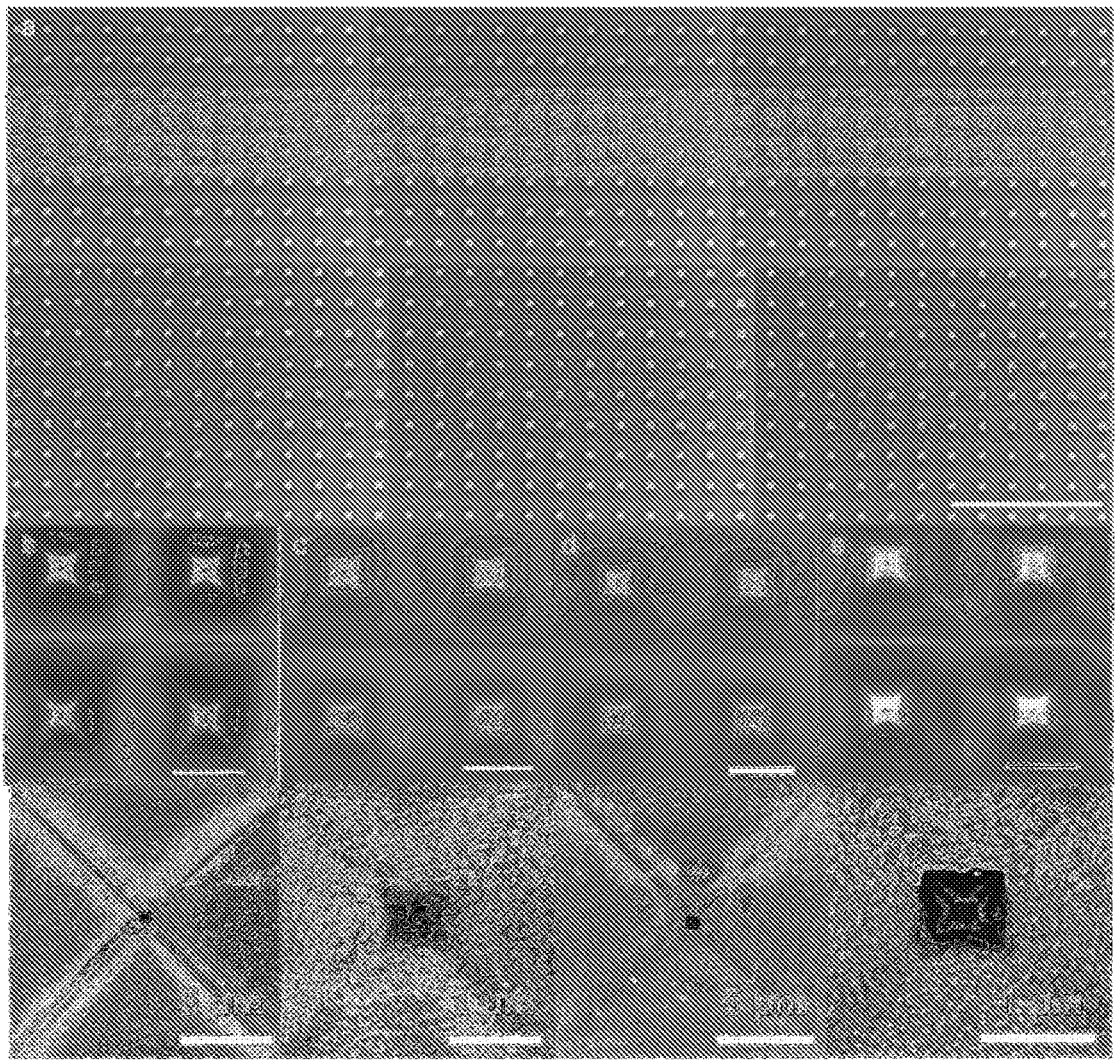
FIG. 8 shows SEM images of a tip array as prepared using the disclosed methods and various quadrants of that tip array, (a) Stitched SEM image of 650+ beam pens uniformly etched at the center of the array, scale bar 100 µm. Zoomed images of the array from (b) quadrant 1, (c) quadrant 2, (d) quadrant 3, and (e) quadrant 4, scale bar 10 µm. (f,g)~200 nm apertures formed with low etchant concentration for 1 minutes. (h,i)~800 nm aperture formed with higher etchant concentration for one minute.

Additionally, the size of the etched feature can be controlled by variation of etching conditions. For example, by changing either the concentration of etchant or the time the array is left exposed to the etchant, the aperture size on the BPL arrays can be controlled from a few hundred nanometers up to several micrometers. An example is shown in FIG. 8 in which a lower and high concentration of etchant is used for a fix amount of time, resulting in roughly 200 nm and 800 nm apertures, respectively.

Fluoro-oils that can be used in the disclosed methods include fluorinated polymers, oils, and lubricants, such as those from, e.g., Krytox. Additionally, the disclosed methods can be performed using a fluorinated solvent, optionally in the presence of one or more viscosity modifiers for assistance during the spin-coating step. The disclosed methods can also be performed with a solid material, that is heated during the surface-wetting step above its melting point so as to flow and conform to the surface, then optionally cooled to solidify again. Non-fluorinated materials can be used in the disclosed methods, such as an organic phase, aqueous phase, or silicone phase gel or liquid or oil or solid mask so long as the phase is immiscible with the components of the procedure. For example, here in the examples, the use of a Krytox GPL with an aqueous based gold etchant was employed.

Beam Pen Lithography

Beam Pen Lithography (BPL) can allow for patterning of sub-micron features over large areas with flexible pattern design, convenient, selective pen tip addressability, and low fabrication cost. As compared to conventional photolithography or contact printing in which only pre-formed patterns (i.e. photomasks) can be duplicated, BPL can provide the flexibility to create different patterns by controlling the movement of a tip array 10 over the substrate and/or by selectively illuminating one or more of the pen tips 14 in the tip array 10. Thus, multiple "dots", for example, can be fabricated to achieve arbitrary features. This approach bypasses the need for, and costs associated with, photomask fabrication in conventional photolithography, allowing one to arbitrarily make many different types of structures without the hurdle of designing a new master via a throughput-impeded serial process.

Figure 1A:
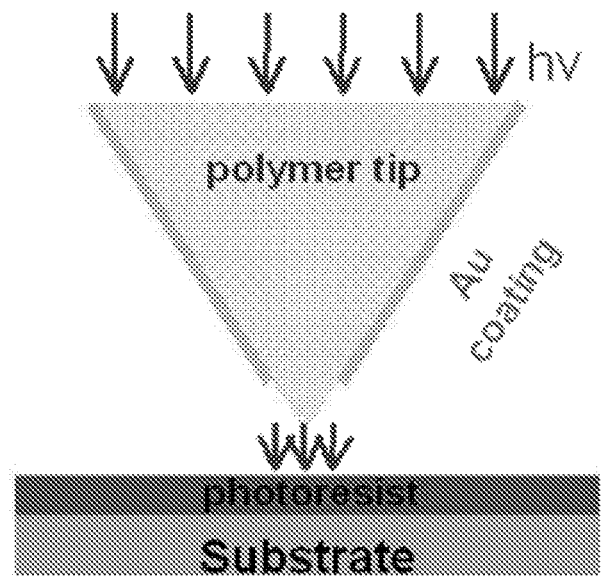
FIGS. 1A and 1B are schematic representations of a beam pen lithography method in accordance with an embodiment of the disclosure.
Figure 1B:
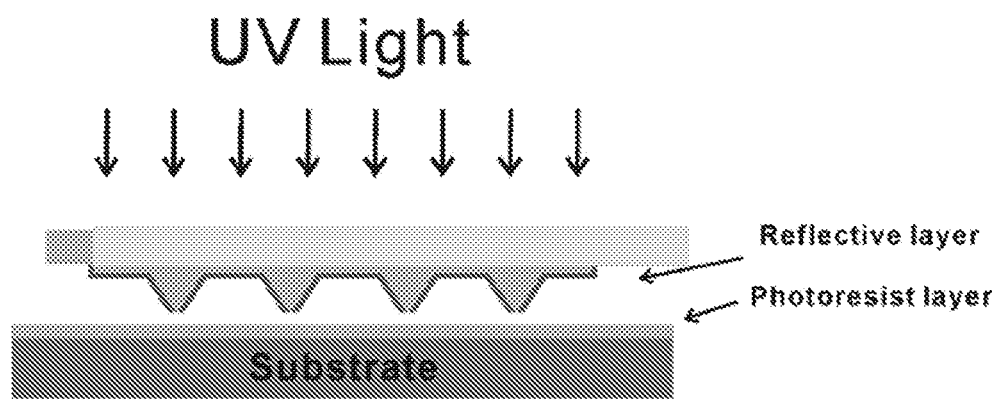

Referring to FIGS. 1A and 1B, an embodiment of BPL generally includes contacting a photosensitive substrate, for example, a substrate having a photosensitive layer 20 coated thereon with a tip array 10 and irradiating a surface of a tip array 10 with a radiation source, such as, for example, UV light. The tip array 10 includes a plurality of tips 14. The tips 14 are formed from a material which is at least translucent to the wavelength of radiation intended for use in patterning, e.g. in a range of 300 nm to 600 nm, and preferably the tips 14 are transparent to such light. Each tip can have a blocking layer 16 disposed thereon, with an aperture 18 defined in the blocking layer 16 and exposing the tip end. The blocking layer 16 serves as a radiation blocking layer 16, channeling the radiation through the material of the tip and out the exposed tip end. The tips 14 can be used to both channel the radiation to a surface in a massively parallel scanning probe lithographic process and to control one or more parameters such as the distance between the tip and the substrate, and the degree of tip deformation. Control of such parameters can allow one to take advantage of near-field effects. In one embodiment, the tips 14 are elastomeric and reversibly deformable, which can allow the tip array 10 to be brought in contact with the substrate without damage to the substrate or the tip array 10. This contact can ensure the generation of near-field effects.

BPL Tip Array

Figure 2A:
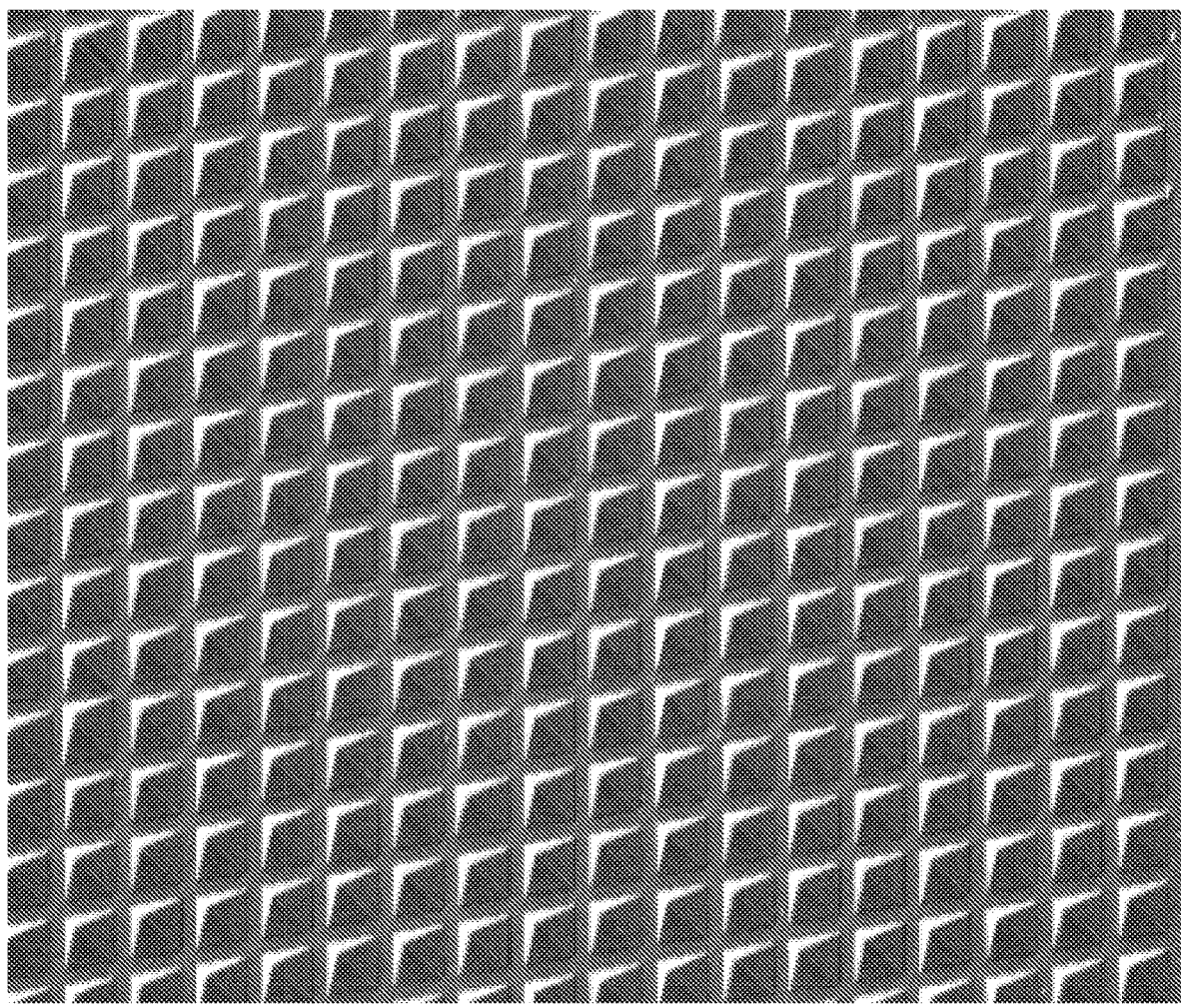
FIG. 2A is an SEM image of a portion of a large scale (approximately 15,000 pens) polymer pen tip array embodiment.
Figure 2B:
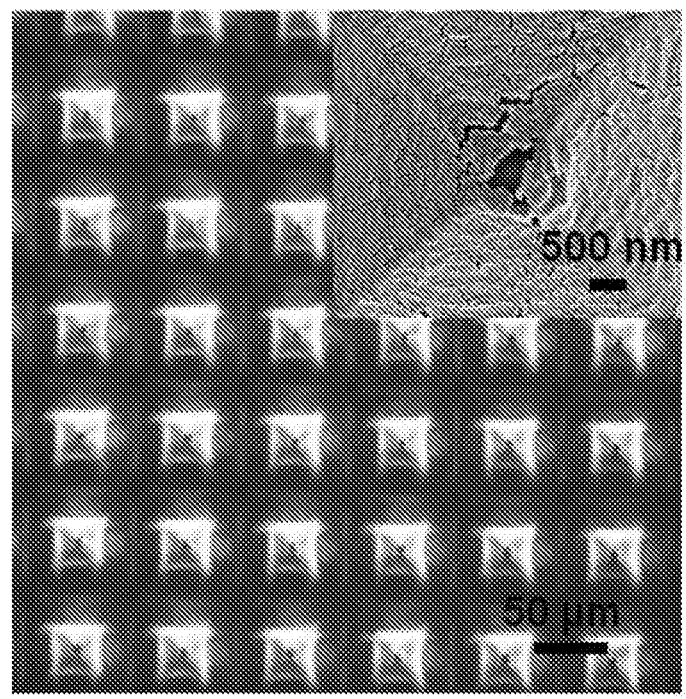
FIG. 2B is an SEM image of a beam pen tip array embodiment, with the inset showing an aperture formed in a tip end.
Figure 2C:
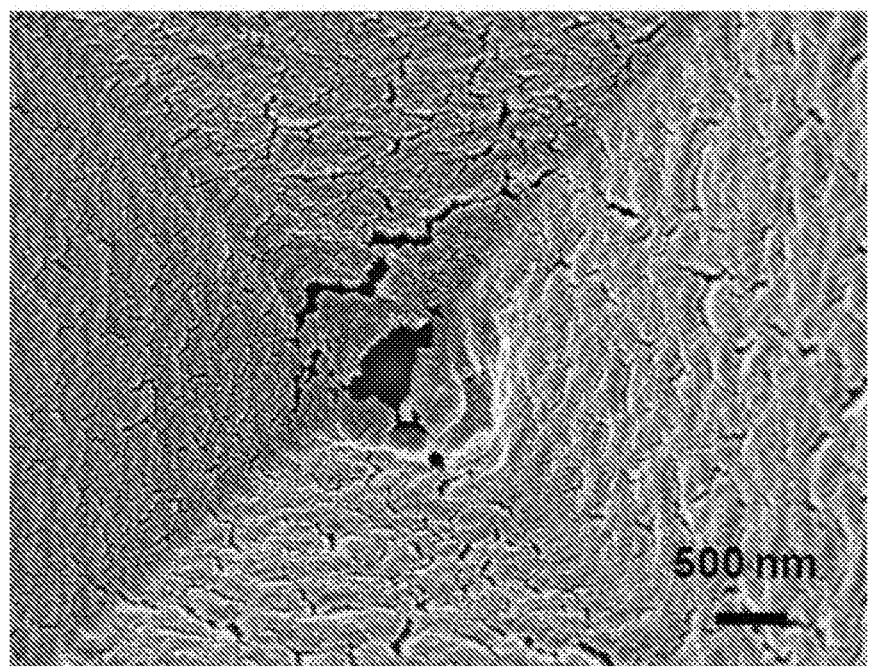
FIG. 2C is an SEM image of the tip end of the single beam pen tip embodiment shown in the inset of FIG. 2B.
Figure 2D:
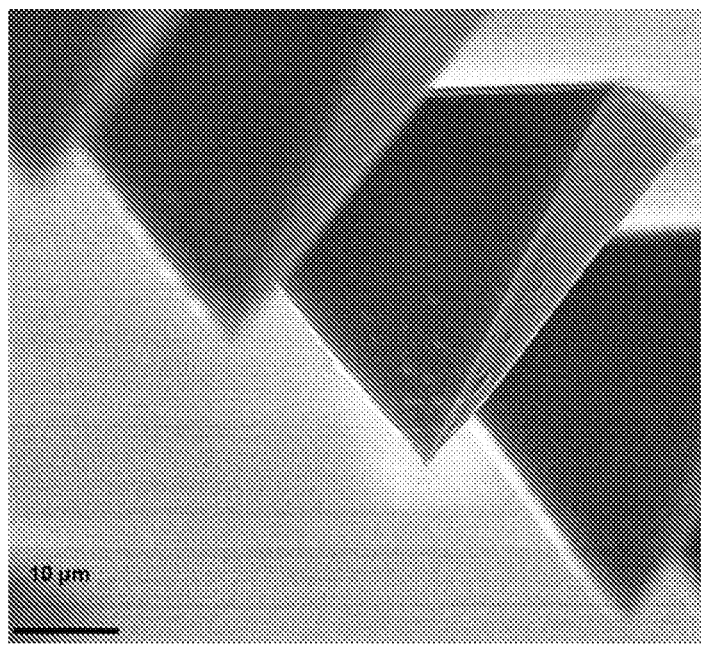
FIG. 2D is an SEM image of a beam pen tip array embodiment having an array of polymer pens coated with a layer of gold and apertures in the gold layer at the tip ends.

Referring to FIGS. 1B and 2A-2D, an embodiment of a BPL tip array 10 includes a tip substrate layer 12 (see FIG. 1B) and a plurality of tips 14 (see FIG. 1B) fixed to the tip substrate layer 12. The tip substrate layer 12 and the plurality of tips 14 are formed of a transparent polymer. The tip substrate layer 12 and the tips 14 can be formed of the same polymer or can be formed of different polymers. The tip array 10 further includes a blocking layer 16 coated on the sidewalls of the tips 14 and on the portions of the tip substrate layer 12 between adjacent tips 14. Referring to FIGS. 2B and 2C, an aperture 18 is defined in the blocking layer 16 at the tip end (e.g., the photosensitive layer 20-contacting end of each of the tips 14), such that the transparent polymer tip end is exposed through the aperture 18.

The tip substrate layer 12 can have any suitable thickness, for example in a range of about 50 µm to about 5 mm, about 50 µm to about 100 m, or about 1 mm to about 5 mm. For example, the tip substrate layer 12 can have a minimum thickness of about 50, 100, 200, 300, 400, 500, 600, 700, 800, 900, 1000, 2000, 3000, 4000, or 5000 µm. For example, the tip substrate layer 12 can have a maximum thickness of about 50, 100, 200, 300, 400, 500, 600, 700, 800, 900, 1000, 2000, 3000, 4000, or 5000 µm. The thickness of the tip substrate layer can be decreased as the rigidity of the polymer used to form the tip substrate layer increases. For example, for a gel polymer (e.g., agarose), the tip substrate layer can have a thickness in a range of about 1 mm to about 5 mm. For other, more rigid, polymers (e.g., PDMS) the tip substrate layer can have a thickness in a range of about 50 µm to about 100 m, for example. The combined thickness of the tip substrate layer 12 and the tips 14 can be in range of about 50 m to about 5 mm. For example, for a gel polymer (e.g., agarose), the combined thickness can be up to about 5 mm. For example, for other polymers (e.g., PDMS) the combined thickness can be less than about 200 µm, preferably less than about 150 µm, or more preferably about 100 µm.

The tip substrate layer 12 can be attached to a transparent rigid support, for example, formed from glass, silicon, quartz, ceramic, polymer, or any combination thereof. The rigid support is preferably highly rigid and has a highly planar surface upon which to mount the tip array 10.

The tip arrays are non-cantilevered and comprise tips 14 which can be designed to have any shape or spacing (pitch) between them, as needed. The shape of each tip can be the same or different from other tips 14 of the array, and preferably the tips 14 have a common shape. Contemplated tip shapes include spheroid, hemispheroid, toroid, polyhedron, cone, cylinder, and pyramid (trigonal or square). The tips 14 have a base portion fixed to the tip substrate layer 12. The base portion preferably is larger than the tip end portion. The base portion can have an edge length in a range of about 1 µm to about 50 µm, or about 5 µm to about 50 µm. For example, the minimum edge length can be about 1, 2, 3, 4, 5, 6, 7, 8, 9, 10, 11, 12, 13, 14, 15, 16, 17, 18, 19, 20 22, 24, 26, 28, 30, 32, 34, 36, 38, 40, 42, 44, 46, 48, or 50 µm. For example, the maximum edge length can be about 1, 2, 3, 4, 5, 6, 7, 8, 9, 10, 11, 12, 13, 14, 15, 16, 17, 18, 19, 20, 22, 24, 26, 28, 30, 32, 34, 36, 38, 40, 42, 44, 46, 48, or 50 µm.

Referring to FIG. 2A, a preferred tip array 10 contains thousands of tips 14, preferably having a pyramidal shape. The substrate-contacting (tip end) portions of the tips 14 each can have a diameter in a range of about 50 nm to about 1 µm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. For example, the minimum diameter can be about 50, 55, 60, 65, 70, 75, 80, 85, 90, 95, 100, 150, 200, 250, 300, 350, 400, 450, 500, 550, 600, 650, 700, 750, 800, 850, 900, 950, or 1000 nm. The substrate-contacting portions of the tips 14 are preferably sharp, so that each is suitable for forming submicron patterns, e.g., less than about 500 nm. The sharpness of the tip is measured by its radius of curvature. The tips 14 can have a radius of curvature, for example, of below about 1 µm, and can be less than about 0.9 µm, less than about 0.8 µm, less than about 0.7 µm, less than about 0.6 µm, less than about 0.5 µm, less than about 0.4 µm, less than about 0.3 µm, less than about 0.2 µm, less than about 0.1 µm, less than about 90 nm, less than about 80 nm, less than about 70 nm, less than about 60 nm, or less than about 50 nm.

The tip-to-tip spacing between adjacent tips 14 (tip pitch) can be in a range of about 1 µm to about over 10 mm, or about 20 µm to about 1 mm. For example, the minimum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm. For example, the maximum tip-to-tip spacing can be about 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, 200 µm, 300 µm, 400 µm, 500 µm, 600 µm, 700 µm, 800 µm, 900 µm, 1 mm, 2 mm, 3 mm, 4 mm, 5 mm, 6 mm, 7 mm, 8 mm, 9 mm, or 10 mm.

The tips 14 of the tip array 10 can be designed to have any desired thickness, but typically the thickness of the tip array 10 is about 50 nm to about 50 µm, about 50 nm to about 1 µm, about 10 µm to about 50 µm, about 50 nm to about 500 nm, about 50 nm to about 400 nm, about 50 nm to about 300 nm, about 50 nm to about 200 nm, or about 50 nm to about 100 nm. For example, the minimum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. For example, the maximum thickness can be about 50 nm, 60 nm, 70 nm, 80 nm, 90 nm, 100 nm, 200 nm, 300 nm, 400 nm, 500 nm, 600 nm, 700 nm, 800 nm, 900 nm, 1 µm, 5 µm, 10 µm, 15 µm, 20 µm, 25 µm, 30 µm, 35 µm, 40 µm, 45 µm, or 50 µm. The thickness of the tip array 10 can be decreased as the rigidity of the polymer used to form the tip substrate layer increases. For example, for a gel polymer (e.g., agarose), the tip array 10 can have a thickness in a range of about 10 µm to about 50 µm. For other polymers (e.g., PDMS), for example, the tip array 10 can have a thickness of about 50 nm to about 1 µm. As used herein, the thickness of the tip array 10 refers to the distance from the tip end to the base end of a tip. The tips 14 can be arranged randomly or in a regular periodic pattern (e.g., in columns and rows, in a circular pattern, or the like).

The blocking layer 16 on the polymer tip sidewalls serves as a radiation blocking layer 16, allowing the radiation illuminated on a surface of the substrate layer opposite the surface to which the tips 14 are fixed to be emitted only through the tip end exposed by the aperture 18 defined in the blocking layer 16. As shown in FIG. 1A, the exposure of a substrate pre-coated with a resist layer 20 with the radiation channeled through the tip ends 18 of the tip array 10 can allow for the formation of a single dot per tip for each exposure. The blocking layer 16 can be formed of any material suitable for blocking (e.g., reflecting) a type of radiation used in the lithography process. For example, the blocking layer 16 can be a metal, such as gold, when used with UV light. Other suitable blocking layers include, but are not limited to, gold, chromium, titanium, silver, copper, nickel, silicon, aluminum, opaque organic molecules and polymers, and combinations thereof. The blocking layer 16 can have any suitable thickness, for example in a range of about 40 nm to about 500 nm. For example, the minimum thickness can be about 40, 45, 50, 55, 60, 65, 70, 75, 80, 85, 90, 95, 100, 150, 200, 250, 300, 350, 400, 450, or 500 nm. For example, the maximum thickness can be about 40, 45, 50, 55, 60, 65, 70, 75, 80, 85, 90, 95, 100, 150, 200, 250, 300, 350, 400, 450, or 500 nm.

Polymeric materials suitable for use in the tip array 10 can have linear or branched backbones, and can be crosslinked or non-crosslinked, depending upon the particular polymer and the degree of compressibility desired for the tip. Cross-linkers refer to multi-functional monomers capable of forming two or more covalent bonds between polymer molecules. Non-limiting examples of cross-linkers include such as trimethylolpropane trimethacrylate (TMPTMA), divinyl-benzene, di-epoxies, tri-epoxies, tetra-epoxies, di-vinyl ethers, tri-vinyl ethers, tetra-vinyl ethers, and combinations thereof.

Thermoplastic or thermosetting polymers can be used, as can crosslinked elastomers. In general, the polymers can be porous and/or amorphous. A variety of elastomeric polymeric materials are contemplated, including polymers of the general classes of silicone polymers and epoxy polymers. Polymers having low glass transition temperatures such as, for example, below 25° C. or more preferably below −50° C., can be used. Diglycidyl ethers of bisphenol A can be used, in addition to compounds based on aromatic amine, triazine, and cycloaliphatic backbones. Another example includes Novolac polymers. Other contemplated elastomeric polymers include methylchlorosilanes, ethylchlorosilanes, and phenylchlorosilanes, polydimethylsiloxane (PDMS).

Other materials include polyethylene, polystyrene, polybutadiene, polyurethane, polyisoprene, polyacrylic rubber, fluorosilicone rubber, and fluoroelastomers.

Further examples of suitable polymers that may be used to form a tip can be found in U.S. Pat. Nos. 5,776,748; 6,596,346; and 6,500,549, each of which is hereby incorporated by reference in its entirety. Other suitable polymers include those disclosed by He et al., Langmuir 2003, 19, 6982-6986; Donzel et al., Adv. Mater. 2001, 13, 1164-1167; and Martin et al., Langmuir, 1998, 14-15, 3791-3795. Hydrophobic polymers such as polydimethylsiloxane can be modified either chemically or physically by, for example, exposure to a solution of a strong oxidizer or to an oxygen plasma.

The polymer of the tip array 10 can be a polymer gel. The gel polymer can comprise any suitable gel, including hydrogels and organogels. For example, the polymer gel can be a silicon hydrogel, a branched polysaccharide gel, an unbranched polysaccharide gel, a polyacrylamide gel, a polyethylene oxide gel, a cross-linked polyethylene oxide gel, a poly(2-acrylamido-2-methyl-1-propanesulfonic acid) (polyAMPS) gel, a polyvinylpyrrolidone gel, a cross-linked polyvinylpyrrolidone gel, a methylcellulose gel, a hyaluronan gel, and combinations thereof. For example, the polymer gel can be an agarose gel. By weight, gels are mostly liquid, for example the gel can be greater than 95% liquid, yet behave like a solid due to the presence of a cross-linked network within the liquid.

The material used to form the tip array 10 has a suitable compression modulus and surface hardness to prevent collapse of the tip during contact with the surface, but too high a modulus and too great a surface hardness can lead to a brittle material that cannot adapt and conform to a substrate surface during exposure. As disclosed in Schmid, et al., Macromolecules, 33:3042 (2000), vinyl and hydrosilane prepolymers can be tailored to provide polymers of different modulus and surface hardness. Thus, in another type of embodiment, the polymer can be a mixture of vinyl and hydrosilane prepolymers, wherein the weight ratio of vinyl prepolymer to hydrosilane crosslinker is about 5:1 to about 20:1, about 7:1 to about 15:1, or about 8:1 to about 12:1.

The material used to form the tip array 10 preferably will have a surface hardness of about 0.2% to about 3.5% of glass, as measured by resistance of a surface to penetration by a hard sphere with a diameter of 1 mm, compared to the resistance of a glass surface (as described in Schmid, et al., Macromolecules, 33:3042 (2000) at p 3044). The surface hardness optionally can be about 0.3% to about 3.3%, about 0.4% to about 3.2%, about 0.5% to about 3.0%, or about 0.7% to about 2.7% of glass. The polymers of the tip array 10 can have a compression modulus of about 10 MPa to about 300 MPa. The tip array 10 preferably comprises a compressible polymer which is Hookean under pressures of about 10 MPa to about 300 MPa. The linear relationship between pressure exerted on the tip array 10 and the feature size allows for control of the near field and feature size using the disclosed methods and tip arrays (see FIG. 2B).

BPL Tip Array Formation

The tip portion of the tip arrays can be made with a master prepared by conventional photolithography and subsequent wet chemical etching. The mold can be engineered to contain as many tips 14 arrayed in any fashion desired. The tips 14 of the tip array 10 can be any number desired, and contemplated numbers of tips 14 include about 1000 tips 14 to about 15 million tips, or greater. The number of tips 14 of the tip array 10 can be greater than about 1 million, greater than about 2 million, greater than about 3 million, greater than about 4 million, greater than 5 million tips 14, greater than 6 million, greater than 7 million, greater than 8 million, greater than 9 million, greater than 10 million, greater than 11 million, greater than 12 million, greater than 13 million, greater than 14 million, or greater than 15 million tips.

Optionally, the tips 14 can be cleaned, for example, using oxygen plasma, prior to coating with the blocking layer 16. The blocking layer 16 can be disposed on the tips 14 by any suitable process, including coating, for example, spin-coating, the tips 14 with the blocking layer 16

Figure 2E:
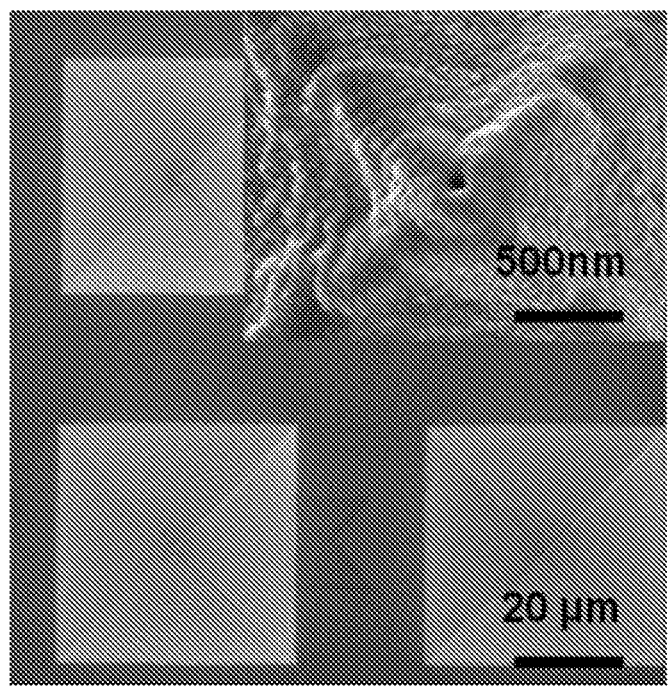
FIG. 2E is an SEM image of a beam pen tip array embodiment having apertures formed by focused ion beam ablation (FIB), with the inset demonstrating that the diameter of the apertures is 50±5 nm.

An aperture 18 in the blocking layer 16 can be formed by any suitable method, including, for example, focused ion beam (FIB) methods (FIG. 2E) or using a lift-off method. The lift-off method can be a dry lift off method. Referring to FIG. 3B, one suitable approach includes applying an adhesive 22, such as poly(methyl methacrylate) (PMMA) on top of the blocking layer 16 of the tip array 10, and removing a portion of the adhesive 22 material disposed at the substrate contacting end of the tips 14 by contacting the tip array 10 to a clean and flat surface, for example a glass surface. The tips 14 can then be immersed in an etching solution to remove the exposed portion of the blocking layer 16 to form the aperture 18 and expose the material of the tip, e.g. the transparent polymer. The remaining adhesive 22 material protects the covered surfaces of the blocking layer 16 from being etched during the etching step. The adhesive can be, for example, PMMA, poly(ethylene glycol) (PEG), polyacrylonitrile, and combinations thereof.

Figure 3A:
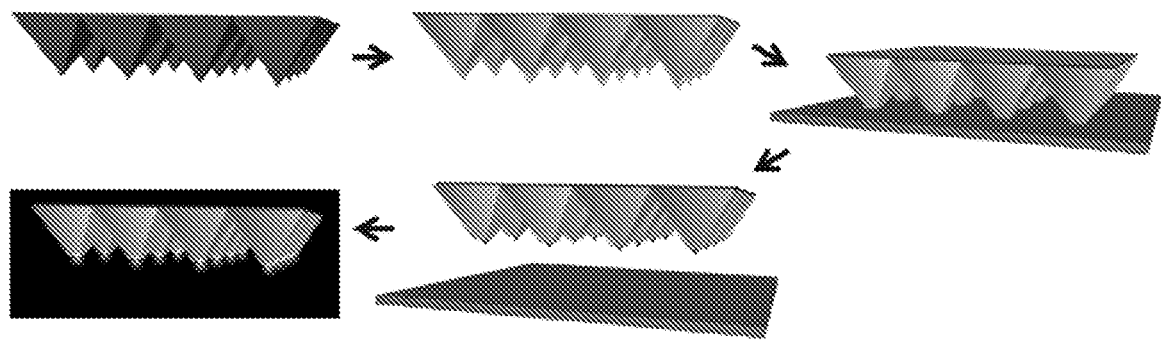
FIG. 3A is a schematic illustration of a method of making a beam pen tip array in accordance with an embodiment of the disclosure.
Figure 3B:
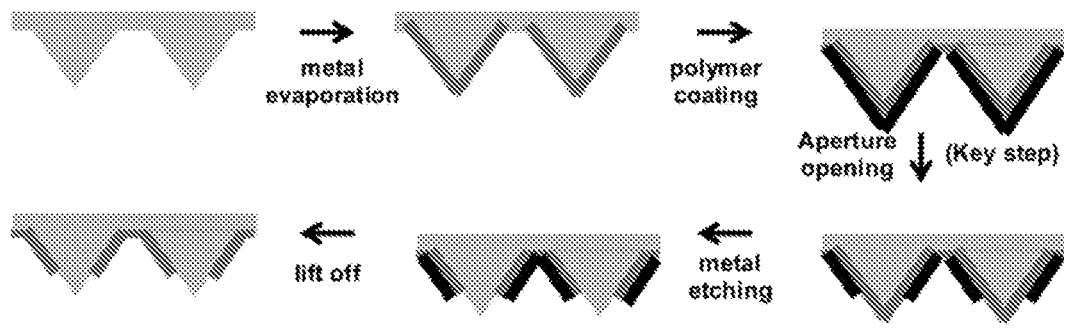
FIG. 3B is a schematic illustration of a method of making a beam pen tip array in accordance with another embodiment of the disclosure.

Referring to FIG. 3A, alternatively, a simple contact approach can be used in which a tip array 10 having the blocking layer 16 is brought in contact with a glass slide or other surface coated with an adhesive 22 material, such as PMMA. Other suitable adhesive 22 materials include, for example, PMMA, PEG, polyacrylonitrile, and combinations thereof. Upon removal of the pen tip from surface coated with the adhesive 22 material, the adhesive 22 material removes the contacted portion of the blocking layer 16, thereby defining an aperture 18 and exposing the tip material, e.g. the transparent polymer.

In either of the above described aperture 18 forming methods, the size of the aperture 18 formed can be controlled by applying different external forces on the backside of the BPL tip array 10. As a result of the flexibility of elastomeric tips 14, the application of force on the backside of the BPL tip array 10 can be used to control the contact area between the tips 14 and adhesive 22 material surface. Referring to FIG. 3A, the BPL tip array 10 can include pyramidal tips 14, with each pyramid-shaped tip being covered by a gold blocking layer 16 having a small aperture 18 defined in the blocking layer 16 at the very end of the tip. The size of the aperture 18 does not significantly change from tip to tip. For example, the size of the aperture 18 can vary less than about 10% from tip to tip. The size of the aperture 18 can be tailored over the 200 nm to 1 to 10 μm ranges, for example, by controlling contact force. For example, the aperture 18 can have a diameter in a range of about 5 nm to about 5 μm, about 30 nm to about 500 nm, or about 200 nm to about 5 μm. For example, the minimum aperture 18 diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. For example, the maximum aperture 18 diameter can be about 5, 10, 15, 20, 25, 30, 35, 40, 45, 50, 55, 60, 65, 70, 75, 80, 85, 90, 95, 100, 200, 300, 400, 500, 600, 700, 800, 900 1000, 1500, 2000, 2500, 3000, 3500, 4000, 4500, or 5000 nm. The contact force optionally can be in a range of about 0.002 N to about 0.2N for a 1 cm² pen array.

For example, a PDMS array of pyramid-shape tips 14 can be fabricated by known methods. (17, 20). For example, each pyramid tip can have a square base with a several tens of µm edge length and can come to a tip that has tip diameter of about 100 nm. The entire array, including tips 14, can then be cleaned, for example, by oxygen plasma and covered with a blocking layer 16 (e.g. gold), by a thermal evaporation method, for example. The coating can include, for example, a layer of gold that is about 80 nm thick with an about 5 nm thick Ti adhesion layer. The tip array 10 is then brought in contact with a glass slide coated with PMMA, an adhesive 22 material, which subsequently removes the Au/Ti layer from the PDMS tips 14 and exposes the underlying transparent PDMS.

Surfaces to be Patterned

The surfaces to pattern by BPL can include any suitable substrate, and preferably one which can be advantageously affected by exposure to radiation. For example, the substrate can be photosensitive or can include a photosensitive layer 20. For example, the photosensitive substrate or photosensitive layer 20 can be a resist layer. The resist layer can be any known resist material, for example SHIPLEY1805 (MicroChem Inc.). Other suitable resist materials include, but are not limited to, Shipley1813 (MicroChem Inc.), Shipley1830 (MicroChem Inc.), PHOTORESIST AZ1518 (MicroChemicals, Germany), PHOTORESIST AZ5214 (MicroChemicals, Germany), SU-8, and combinations thereof. Other examples of photosensitive materials include, but are not limited to, liquid crystals and metals. For examples, the substrate can include metal salts that can be reduced when exposed to the radiation. Substrates suitable for use in methods disclosed herein include, but are not limited to, metals, alloys, composites, crystalline materials, amorphous materials, conductors, semiconductors, optics, fibers, inorganic materials, glasses, ceramics (e.g., metal oxides, metal nitrides, metal silicides, and combinations thereof), zeolites, polymers, plastics, organic materials, minerals, biomaterials, living tissue, bone, and laminates and combinations thereof. The substrate can be in the form of films, thin films, foils, and combinations thereof. A substrate can comprise a semiconductor including, but not limited to one or more of: crystalline silicon, polycrystalline silicon, amorphous silicon, p-doped silicon, n-doped silicon, silicon oxide, silicon germanium, germanium, gallium arsenide, gallium arsenide phosphide, indium tin oxide, graphene, and combinations thereof. A substrate can comprise a glass including, but not limited to, one or more of undoped silica glass ($SiO_2$), fluorinated silica glass, borosilicate glass, borophosphorosilicate glass, organosilicate glass, porous organosilicate glass, and combinations thereof. The substrate can be a non-planar substrate, including, but not limited to, one or more of pyrolytic carbon, reinforced carbon-carbon composite, a carbon phenolic resin, and combinations thereof. A substrate can comprise a ceramic including, but not limited to, one or more of silicon carbide, hydrogenated silicon carbide, silicon nitride, silicon carbonitride, silicon oxynitride, silicon oxycarbide, high-temperature reusable surface insulation, fibrous refractory composite insulation tiles, toughened unipiece fibrous insulation, low-temperature reusable surface insulation, advanced reusable surface insulation, and combinations thereof. A substrate can comprise a flexible material, including, but not limited to one or more of: a plastic, a metal, a composite thereof, a laminate thereof, a thin film thereof, a foil thereof, and combinations thereof.

The photosensitive substrate or the photosensitive layer 20 can have any suitable thickness, for example in a range of about 100 nm to about 5000 nm. For example, the minimum photosensitive substrate or photosensitive layer 20 thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. For example, the maximum photosensitive substrate or photosensitive layer 20 thickness can be about 100, 150, 200, 250, 300, 350, 400, 450 or 500, 550, 600, 650, 700, 750, 800, 850, 900, 950, 1000, 1500, 2000, 2500, 3000, 3500, 4000, 4500, or 5000 nm. The diameter of the indicia formed by the tip array 10 can be modulated by modifying the resist material used and/or the thickness of the photosensitive substrate or photosensitive layer 20. For example, under the same radiation conditions, a thicker photosensitive layer can result in indicia having larger diameters. At constant photosensitive layer thickness, an increase radiation intensity can results in indicia having larger diameters.

Patterning

BPL can be performed using any suitable platform, for example, a Park AFM platform (XEP, Park Systems Co., Suwon, Korea) equipped with a halogen light source. BPLAs another example, a Zeiss microscope can be used with a light source having a wavelength in a range of about 360 nm to about 450 nm. Movement of the tip array 10 when using the Zeiss microscope can be controlled, for example, by the microscope stage.

Referring again to FIGS. 1A and 1B, in an embodiment of the method, a transparent polymer tip array 10 is brought in contact with a photosensitive layer 20, for example, for example SHIPLEY1805 (MicroChem Inc.) photoresist material, followed by exposure (e.g. illumination) of the top surface (the substrate layer) of the tip array 10 with a radiation source. As a result of the blocking layer 16 blocking the radiation (e.g., by reflection), the radiation is transmitted through the transparent polymer and out the portion of the transparent polymer exposed by the aperture 18 (i.e., the tip end). Historically, photolithography has used ultraviolet light from gas-discharge lamps using mercury, sometimes in combination with noble gases such as xenon. These lamps produce light across a broad spectrum with several strong peaks in the ultraviolet range. This spectrum is filtered to select a single spectral line, for example the "g-line" (436 nm) or "i-line" (365 nm). More recently, lithography has moved to "deep ultraviolet," for example wavelengths below 300 nm, which can be produced by excimer lasers. Krypton fluoride produces a 248-nm spectral line, and argon fluoride a 193-nm line. In principle, the type of radiation used with the present apparatus and methods is not limited. One practical consideration is compatibility with the pen array materials. Radiation in the wavelength range of about 300 nm to about 600 nm is preferred, optionally 380 nm to 420 nm, for example about 365 nm, about 400 nm, or about 436 nm. For example, the radiation optionally can have a minimum wavelength of about 300, 350, 400, 450, 500, 550, or 600 nm. For example, the radiation optionally can have a maximum wavelength of about 300, 350, 400, 450, 500, 550, or 600 nm.

The photosensitive layer 20 can be exposed by the radiation transmitted through the polymer tip for any suitable time, for example in a range of about 1 second to about 1 minute. For example, the minimum exposure time can be about 1, 2, 3, 4, 5, 6, 7, 8, 9, 10, 20, 30, 40, 50, or 60 seconds.

For example, the maximum exposure time can be about 1, 2, 3, 4, 5, 6, 7, 8, 9, 10, 20, 30, 40, 50, or 60 seconds.

The tip array 10 and/or the substrate can be moved during patterning to form the desired indicia. For example, in one embodiment, the tip array 10 is moved while the substrate is held stationary. In another embodiment, the tip array 10 is held stationary while the substrate is moved. In yet another embodiment, both the tip array 10 and the substrate are moved.

The method can further include developing the photosensitive layer 20, for example by any suitable process known in the art. For example, when a resist layer is used, the exposed resist layer can be developed for by exposed for about 30 seconds in MF319 (Rohm & Haas Electronic Materials LLC). The resist layer can be a positive resist or a negative resist. If a positive resist layer is used, developing of the resist layer 20 removes the exposed portion of the resist layer. If a negative resist layer is used, developing of the resist layer removes the unexposed portion of the resist layer. Optionally, the method can further include depositing a patterning layer on the substrate surface after exposure followed by lift off of the resist layer to thereby form the patterning layer into the indicia printed on the resist layer by BPL. The patterning layer can be a metal, for example, and can be deposited, for example, by thermal evaporation. The resist lift off can be performed using, for example, acetone.

Figure 4A:
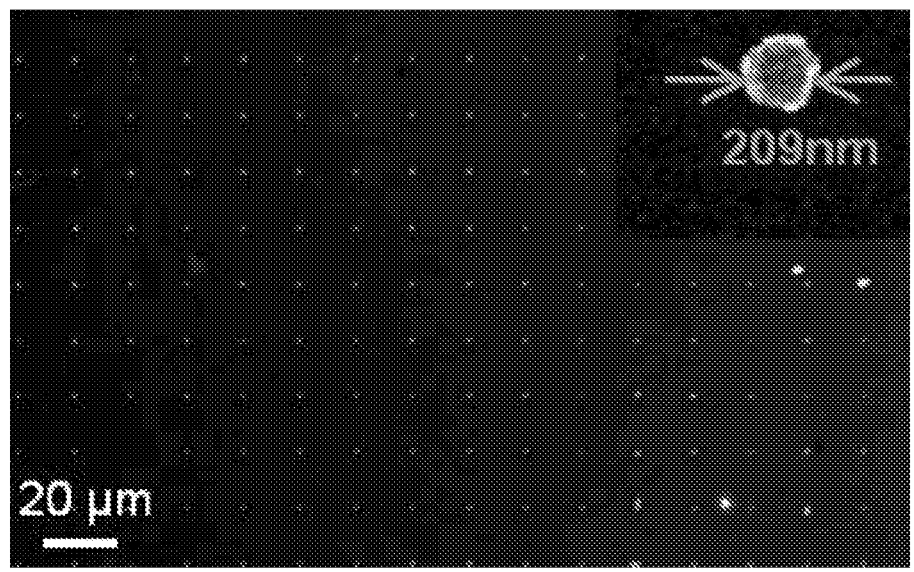
FIG. 4A is a dot array wherein each dot was created by different beam pen tips in a tip array embodiment under a single exposure. The diameter of the individual dots is approximately 209 nm (inset).
Figure 4B:
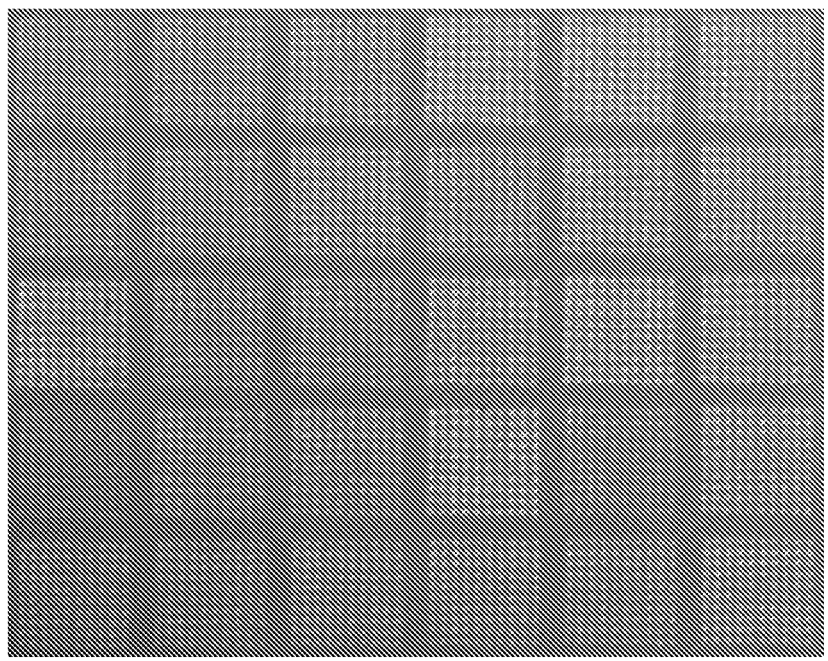
FIG. 4B is an optical image of an array of dot arrays made by an embodiment of beam pen lithography as described herein.
Figure 4C:
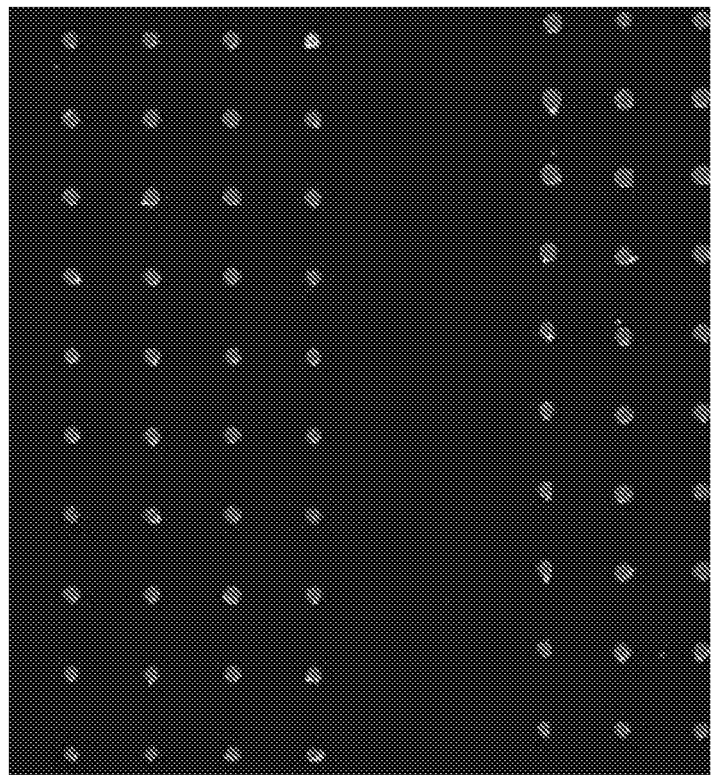
FIG. 4C is an SEM image of a dot array of FIG. 4B, illustrating that each array contains 10×10 dots; each 10×10 dot array was made by a single tip.
Figure 4D:
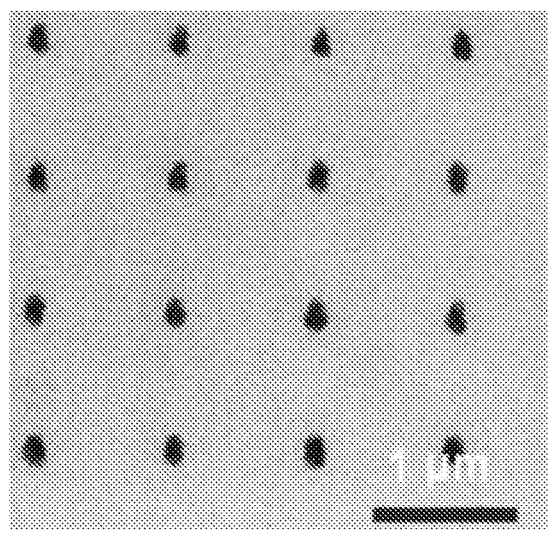
FIG. 4D is an SEM image of a chromium dot array created by an embodiment of beam pen lithography described herein, after metal evaporation and resist lift-off, with the apertures in the beam pen tip array being formed by FIB.

Referring to FIGS. 4B and 4C, when using large-scale 2D arrays of BPL tips (15,000 pens per $cm^2$), BPL can be used to do very high throughput lithography, yielding thousands of parallel-produced patterns at a time. The patterns can be the same, for example by using a uniform tip array 10. In the alternative, at least some of the patterns can differ from each other, for example by using a tip array 10 which is non-uniformly masked and lateral displacement of the tip array 10 while patterning which exceeds the tip pitch dimension. FIG. 4D illustrates a uniform dot array formed by a beam pen tip array 10 having apertures formed by FIB using an about 400 nm halogen light source and 40 nm thick resist layer 20. The aperture 18 diameter was 50±5 nm. After chromium evaporation and resist lift off, chromium dot features with diameters of 111±11 nm were generated. This feature size is below the diffraction limit of the light source.

Another factor contributing to BPL resolution is the tip aperture 18 size, which controls the area of the resist which is exposed to light from the tip. Referring to FIG. 4A, with a near UV light or halogen light source and conventional photolithography conditions, dot sizes close to and below the light diffraction limit, of about 200 nm (FIG. 4A inset) can be created. The dot pattern of FIG. 4A was generated using a radiation having a wavelength of about 380 nm to about 420 nm. Without intending to be bound by any particular theory, it is believed that this small feature size may be attributed to near-field effects at the point-of-contact between the tip and surface. Even though the aperture 18 used to create the dots of FIG. 4A is 500 nm, the contact area is much smaller, acting like a light pipe. Further optimization of the photolithography conditions can include, for example, using deep-UV illumination, thinner resist layers, and high resolution resist materials, which may improve BPL resolution down to the sub-100 nm range.

Large arrays of dots can be made simultaneously by moving the array of the surface with a piezo stage while illuminating the tip array 10 from the back side of the tips 14, for example, through the tip substrate layer 12. As shown in FIGS. 4B and 4C, 10×10 gold dot arrays with a feature spacing of 6 μm can be generated. The dot arrays were generated using 90% maximum power light intensity, a 20 second exposure time. The features have a diameter of 750±80 nm. The radiation can be kept on during the entire patterning process. Accordingly, the lateral and vertical movement of the tip array 10 is done rapidly to minimally expose the resist areas that are not intended for patterning. For example, the tip array 10 movement across the sample can be done in a range of about 10 μm/s to about 100 μm/s. For example, the minimum rate of movement of the tip array 10 across the substrate can be about 10, 20, 30, 40, 50, 60, 70, 80, 90, or 100 μm/s. For example, the maximum rate of movement of the tip array 10 across the substrate can be about 10, 20, 30, 40, 50, 60, 70, 80, 90, or 100 μm/s. Using a tip array 10 having 15,000 tips 14, 15,000 patterns can be simultaneously generated in about 30 minutes (for a total of 1.5 million features).

Figure 5A:
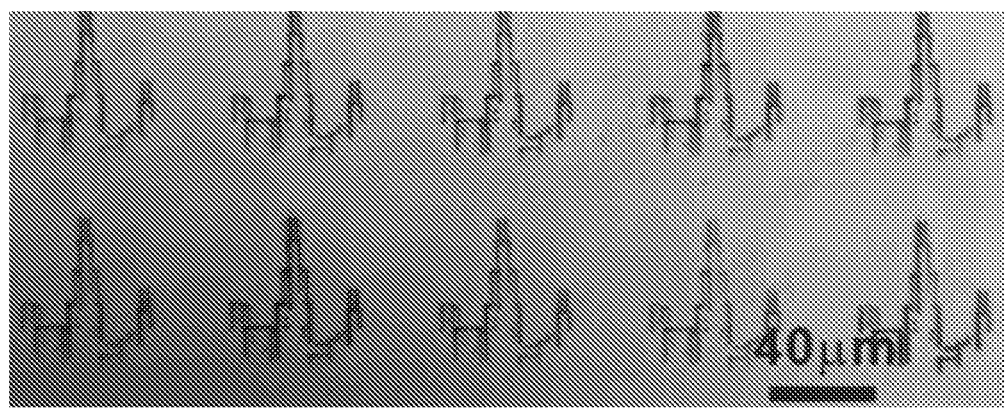
FIG. 5A is an optical developed photoresist pattern of a representative region of approximately 15,000 miniaturized duplicates of the Chicago skyline made by beam pen lithography.
Figure 5B:
FIG. 5B is a zoom-in optical image of a representative replica of FIG. 5A. The inset shows a magnified SEM image of the dots.

As shown in FIGS. 5A and 5B, BPL was used to create 15,000 replicas of a pattern of the Chicago skyline comprised of 182 dots (FIG. 5A). The tip array 10 used to create the pattern had 500 nm diameter apertures. These structures were created by holding the pen array at each spot for about 20 s and traveling between spots at a speed of 60 km/s. The dots are 450±70 nm in diameter and 600 nm apart (FIG. 5B).

The individual tips 14 within a BPL array can be addressed by selective illumination. For example, patterning can be achieved with the illumination of fewer than all of the tips 14 in the array, for example with one or a selected plurality of the tips 14 in the tip array 10. Selective illumination of the tips 14 can be performed, for example, by selectively focusing light through the microscopic bases of each tip. The tip array 10 can also include one or more spatial light modulators capable of blocking certain tips 14 from exposure to the light. The spatial light modulators can be static and/or dynamically controllable. For example, the spatial light modulates can be shutters. The spatial light modulators can be formed using a variety of materials, including, for example, liquid crystals. The spatial light modulators can be, for example, a mask, which is not dynamically controllable. The spatial light modulators can be placed or formed as a part of the tip substrate layer 12. Because the base of the tips 14 has edge lengths on the order of microns, the spatial light modulators need not be created on the nanoscale in order to result in sub-micron sized indicia. Rather it is the channeling of the radiation through the transparent polymer and the aperture 18 that allows for the sub-micron patterning. Tip addressability has been a major challenge for SPL methods. With passive arrays, one simply achieves duplication—each tip does exactly what the other tips 14 do. Many different methods of actuation have been evaluated with limited success, especially where lithography is the primary goal. Thermal, mechanical, electrical and magnetic actuation, all have been studied. With BPL, the radiation can be used as a convenient method to achieve multiplexed addressability of each tip within a complex and large array.

For example, one can take the tip array 10 and use a photo mask, for example, a Cr photo mask, to cover all of the pyramid bases that one wants to turn off in a BPL experiment. Under homogeneous illumination, each active tip in the array can be used to fabricate repeat arbitrary patterns. When the radiation source was illuminated on selected BPL tips 14, only those tips 14 under illumination can channel energy to the substrate and expose the resist layer, while no patterns resulted from other area without illumination, although all of the tips 14 made contacts with the substrate simultaneously (FIG. 4B). This approach allows for two orthogonal levels of control, using selective illumination for tip-attenuation and tip movement. When coupled with spatial light modulator, each tip can be individually addressed to fabricate different patterns. For example, a portion of the tips 14 in a tip array 10 can be selectively illuminated and first pattern can be formed. The tip array 10 can then be shifted and a second pattern can be formed. The tip array 10 can be shifted, for example, a distance at least equal to the tip pitch to form with the second pattern step a variety of different patterns on the substrate. For example, as a result of the selective illumination of the tips 14, regions of the substrate would include only the first pattern, only the second pattern, or a combination of both patterns.

The features that can be patterned range from sub-100 nm to 1 mm in size or greater, and can be controlled by altering the exposure time and/or the contacting pressure of the tip array 10.

The BPL tip arrays can exhibit pressure dependence which results from the compressible nature of the polymer used to form the tip array 10. Indeed, the microscopic, preferably pyramidal, tips 14 can be made to deform with successively increasing amounts of applied pressure, which can be controlled by simply extending the piezo in the vertical direction (z-piezo). The controlled deformation of the tip array 10 can be used as an adjustable variable, allowing one to control tip-substrate contact area and resulting feature size. The pressure of the contact can be controlled by the z-piezo of a piezo scanner. The more pressure (or force) exerted on the tip array 10, the larger the feature size. Thus, any combination of contacting time and contacting force/pressure can provide a means for the formation of a feature size from about 30 nm to about 1 mm or greater. Within the pressure range allowed by z-piezo extension of about 5 to about 25 µm, one can observe a near linear relationship between piezo extension and feature size at a fixed contact time of 1 s. The substrate layer of the tip arrays can deform before deformation of the tips 14 occurs, which can offer a buffering provides extra tolerance in bringing all of the tips 14 in contact with the surface without tip deformation and significantly changing the intended feature size. The contacting pressure of the tip array 10 can be about 10 MPa to about 300 MPa.

At very low contact pressures, such as pressures of about 0.01 to about 0.1 g/cm² for the preferred materials described herein, the feature size of the resulting indicia is independent of the contacting pressure, which allows for one to level the tip array 10 on the substrate surface without changing the feature size of the indicia. Such low pressures are achievable by 0.5 µm or less extensions of the z-piezo of a piezo scanner to which a tip array 10 is mounted, and pressures of about 0.01 g/cm² to about 0.1 g/cm² can be applied by z-piezo extensions of less than 0.5 µm. This "buffering" pressure range allows one to manipulate the tip array 10, substrate, or both to make initial contact between tips 14 and substrate surface without compressing the tips 14, and then using the degree of compression of tips 14 (observed by changes in reflection of light off the inside surfaces of the tips 14) to achieve a uniform degree of contact between tips 14 and substrate surface. This leveling ability is important, as non-uniform contact of the tips 14 of the tip array 10 can lead to non-uniform indicia. Given the large number of tips 14 of the tip array 10 (e.g., 11 million in an example provided herein) and their small size, as a practical matter it may be difficult or impossible to know definitively if all of the tips 14 are in contact with the surface. For example, a defect in a tip or the substrate surface, or an irregularity in a substrate surface, may result in a single tip not making contact while all other tips 14 are in uniform contact. Thus, the disclosed methods provide for at least substantially all of the tips 14 to be in contact with the substrate surface (e.g., to the extent detectable). For example, at least 90%, at least 95%, at least 96%, at least 97%, at least 98%, or at least 99% of the tips 14 will be in contact with the substrate surface.

The leveling of the tip array 10 and substrate surface with respect to one another can be assisted by the transparent, or at least translucent nature of the tip array 10 and tip substrate layer 12, which allow for detection of a change in reflection of light that is directed from the top of the tip array 10 (i.e., behind the base of the tips 14 and common substrate) through to the substrate surface. The intensity of light reflected from the tips 14 of the tip array 10 increases upon contact with the substrate surface (e.g., the internal surfaces of the tip array 10 reflect light differently upon contact). By observing the change in reflection of light at each tip, the tip array 10 and/or the substrate surface can be adjusted to effect contact of substantially all or all of the tips 14 of the tip array 10 to the substrate surface. Thus, the tip array 10 and common substrate preferably are translucent or transparent to allow for observing the change in light reflection of the tips 14 upon contact with the substrate surface. Likewise, any rigid backing material to which the tip array 10 is mounted is also preferably at least transparent or translucent.

The contacting time for the tips 14 can be from about 0.001 seconds to about 60 seconds. For example, the minimum contact time can be about 0.001, 0.01, 0.1, 1, 10, 20, 30, 40, 50, or 60 seconds. For example, the maximum contact time can be about 0.001, 0.01, 0.1, 1, 10, 20, 30, 40, 50, or 60 seconds. The contacting force can be controlled by altering the z-piezo of the piezo scanner or by other means that allow for controlled application of force across the tip array 10.

The substrate surface can be contacted with a tip array 10 a plurality of times, wherein the tip array 10, the substrate surface or both move to allow for different portions of the substrate surface to be contacted. The time and pressure of each contacting step can be the same or different, depending upon the desired pattern. The shape of the indicia or patterns has no practical limitation, and can include dots, lines (e.g., straight or curved, formed from individual dots or continuously), a preselected pattern, or any combination thereof.

The indicia resulting from the disclosed methods have a high degree of sameness, and thus are uniform or substantially uniform in size, and preferably also in shape. The individual indicia feature size (e.g., a dot or line width) is highly uniform, for example within a tolerance of about 5%, or about 1%, or about 0.5%. The tolerance can be about 0.9%, about 0.8%, about 0.7%, about 0.6%, about 0.4%, about 0.3%, about 0.2%, or about 0.1%. Non-uniformity of feature size and/or shape can lead to roughness of indicia that can be undesirable for sub-micron type patterning.

The feature size can be about 10 nm to about 1 mm, about 10 nm to about 500 µm, about 10 nm to about 100 µm, about 50 nm to about 100 µm, about 50 nm to about 50 µm, about 50 nm to about 10 µm, about 50 nm to about 5 µm, or about 50 nm to about 1 µm. Features sizes can be less than 1 µm, less than about 900 nm, less than about 800 nm, less than about 700 nm, less than about 600 nm, less than about 500 nm, less than about 400 nm, less than about 300 nm, less than about 200 nm, less than about 100 nm, or less than about 90 nm.

System for Beam Pen Lithography

A system for BPL can include a radiation source for emitting a radiation in a path and a tip array as disclosed herein disposed in the path with the radiation being incident upon the tip substrate layer, such that the radiation is emitted through the aperture-exposed tip ends of the tips. The system can further include a substrate stage disposed for selective contact with the tip array. The substrate stage can be, for example, a piezo stage. The tip array can optionally be operatively coupled to the radiation source and/or the substrate stage to perform a patterning method described herein. The apparatus can also include one or more spatial light modulators disposed in the radiation path between the radiation source and the tip array, for selective illumination of individual tips 14 in the array. For example, the system can include an array of spatial light modulators that are individually and dynamically controllable to selectively reflect the incident radiation or allow it to pass to the tip substrate layer and tip(s). The spatial light modulators can be coupled to the BPL tip array 10. For example, the spatial light modulators can be disposed on the tip substrate layer 12 of the tip array 10.

What is claimed is:

1. A method of making a beam pen lithography tip array, comprising
providing a tip array comprising a plurality of tips fixed to a common substrate, the common substrate fixed to a support, the plurality of tips and common substrate each comprising an at least translucent material, each tip having a radius of curvature of less than 1 µm, the tip array further comprising a coated surface comprising a blocking layer, the coated surface disposed over the plurality of tips;
casting a mask material onto the tip array to form a mask over the tip array that provides an exposed portion of each tip of the tip array, wherein the mask material and the blocking layer interact via capillary action to form the mask over the tip array and provide substantially uniform exposed portions of each tip, and
forming an aperture at the exposed portion of each tip by removing the blocking layer at the exposed portion of each tip.

2. The method of claim 1, wherein the thickness of the common substrate is 50 µm to 100 µm, the common substrate and tips have a combined thickness of less than 200 µm, or both.

3. The method of claim 1, wherein the blocking layer comprises a metal, a metal oxide, a polymer, a composite, a ceramic, or a combination thereof.

4. The method of claim 1, wherein the blocking layer comprises a metal.

5. The method of claim 1, wherein the blocking layer comprises a self-assembled monolayer (SAM) on a metal.

6. The method of claim 1, wherein the mask material comprises an oil or polymer.

7. The method of claim 6, wherein the mask material comprises a thermoplastic, or comprises poly(methyl methacrylate) (PMMA) or polypropylene (PP).

8. The method of claim 1, wherein the mask material is a liquid and the casting comprises spin coating the liquid onto the tip array or the mask material is a solid and the casting comprises melting the solid to a liquid or semi-solid form before and during application to the tip array.

9. The method of claim 1, wherein the mask material is a solid and the casting comprises melting the solid to a liquid or semi-solid form before and during application to the tip array.

10. The method of claim 1, wherein the mask material comprises a fluoro oil.

11. The method of claim 1, wherein the blocking layer comprises a SAM-modified metal and the mask material comprises an oil, and optionally wherein the metal of the SAM-modified metal comprises Au, Ag, Pt, or Cu.

12. The method of claim 1, wherein the blocking layer comprises gold and the mask material comprises a thermoplastic, and optionally wherein the thermoplastic comprises PMMA.

13. The method of claim 1, wherein the blocking layer comprises gold having a perfluroinated alkane thiol SAM and the mask material comprises a perfluorinated oil.

14. The method of claim 1, wherein the casting comprises spin coating, drop casting, spray coating, or film coating.

15. The method of claim 1, wherein the at least translucent material comprises a polymer.

16. The method of claim 15, wherein the at least translucent material comprises a crosslinked polymer or a polymer gel.

17. The method of claim 1, wherein the tip material is elastomeric, reversibly deformable, and/or substantially transparent.

18. The method of claim 1, wherein the tip material comprises polydimethylsiloxane (PDMS) or trimethylsiloxy terminated vinylmethylsiloxane-dimethysiloxane copolymer, a methylhydrosiloxane-dimethylsiloxane copolymer, or a mixture thereof.

19. The method of claim 1, wherein the aperture has a diameter of 30 nm to 20 µm.

20. A method for sub-micron scale printing of indicia on a photosensitive substrate, comprising:
orienting the photosensitive substrate near or in contact with a tip array prepared by the method of claim 1, wherein the photosensitive substrate and the tip array are within 1 µm of each other;
irradiating at least one tip of the tip array with a radiation source, to transmit radiation through the tip aperture; and
exposing a portion of the photosensitive substrate with the transmitted radiation to print the indicia on the substrate surface.

* * * * *